United States Patent
Suenaga et al.

(10) Patent No.: US 9,882,546 B2
(45) Date of Patent: Jan. 30, 2018

(54) ALKALI-NIOBATE-BASED PIEZOELECTRIC THIN FILM ELEMENT

(71) Applicant: Hitachi Metals, Ltd., Tokyo (JP)

(72) Inventors: Kazufumi Suenaga, Tsuchiura (JP); Kenji Shibata, Tsukuba (JP); Kazutoshi Watanabe, Tsuchiura (JP); Fumimasa Horikiri, Nagareyama (JP); Masaki Noguchi, Tsuchiura (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 340 days.

(21) Appl. No.: 14/616,656

(22) Filed: Feb. 7, 2015

(65) Prior Publication Data

US 2015/0229290 A1 Aug. 13, 2015

(30) Foreign Application Priority Data

Feb. 13, 2014 (JP) .................................. 2014-025271

(51) Int. Cl.
*H01L 41/187* (2006.01)
*H03H 9/17* (2006.01)
(Continued)

(52) U.S. Cl.
CPC ........ *H03H 9/171* (2013.01); *H03H 9/02015* (2013.01); *H03H 2009/155* (2013.01); *Y10T 29/42* (2015.01)

(58) Field of Classification Search
CPC ........... H03H 9/02015; H03H 9/02047; H03H 9/02031; H03H 9/02157; H03H 9/02244
See application file for complete search history.

(56) References Cited

U.S. PATENT DOCUMENTS 7,388,318 B2 * 6/2008 Yamada .................... H03H 3/02
310/324
2001/0054859 A1 * 12/2001 Hammer ............. H01L 41/0477
310/363
(Continued)

FOREIGN PATENT DOCUMENTS

JP 2007-019302 A 1/2007
JP 2012-033693 A 2/2012

OTHER PUBLICATIONS

Chan Min Kang, Gwan-Ha Kim, Kyoung-Tae Kim, andChang-Il Kim, "Etching Characteristics of $(Na_{0.5}K_{0.5})NbO_3$ Thin Films in an Inductively Coupled $Cl_2/Ar$ Plasma", Ferroelectrics, 357, 179-184 (2007).

(Continued)

*Primary Examiner* — J. San Martin
(74) *Attorney, Agent, or Firm* — McGinn IP Law Group, PLLC

(57) ABSTRACT

An alkali-niobate-based piezoelectric thin film element includes a substrate, a lower electrode film on the substrate, a piezoelectric thin film on the lower electrode film, and an upper electrode film on the piezoelectric thin film. The piezoelectric thin film is made of an alkali-niobate-based piezoelectric material represented by the formula $(Na_xK_yL_{1-z})NbO_3$, where $0 \le x \le 1$, $0 \le y \le 1$, $0 \le z \le 0.2$, and $x+y+z=1$. The piezoelectric thin film has an element pattern and contains a metal element in a higher concentration near the upper electrode film than near the lower electrode film. The average concentration of the metal element is $5 \times 10^{17}$ atoms/$cm^3$ or less in a region within $\pm 15\%$ of the thickness of the piezoelectric thin film from a position corresponding to half the thickness of the piezoelectric thin film.

3 Claims, 7 Drawing Sheets

(51) Int. Cl.
*H03H 9/02* (2006.01)
*H03H 9/15* (2006.01)

(56) References Cited

U.S. PATENT DOCUMENTS

| | | | | |
|---|---|---|---|---|
| 2006/0066176 A1* | 3/2006 | Nanataki | ............... | C04B 35/495 310/311 |
| 2007/0024162 A1* | 2/2007 | Shibata | ................. | C04B 35/495 310/358 |
| 2009/0236944 A1* | 9/2009 | Shibata | ............... | H01L 41/0805 310/358 |
| 2012/0161588 A1* | 6/2012 | Hatano | ................. | C04B 35/495 310/365 |
| 2013/0009519 A1* | 1/2013 | Shibata | ................. | C23C 14/025 310/348 |
| 2013/0015392 A1* | 1/2013 | Suenaga | ............. | H01L 41/0805 252/62.9 PZ |
| 2014/0055009 A1* | 2/2014 | Hatano | ............... | H01L 41/1873 310/366 |
| 2016/0155929 A1* | 6/2016 | Ishii | ........................ | H01L 41/43 310/364 |
| 2016/0365504 A1* | 12/2016 | Suenaga | ............. | H01L 41/0471 |

OTHER PUBLICATIONS

Japanese Office Action dated Nov. 21, 2017 in Japanese Application No. 2014-025271 with an English translation thereof.

* cited by examiner

ALKALI-NIOBATE-BASED PIEZOELECTRIC THIN FILM ELEMENT

The present application is based on Japanese patent application No. 2014-025271 filed on Feb. 13, 2014, the entire contents of which are incorporated herein by reference.

BACKGROUND OF THE INVENTION

1. Field of the Invention

The present invention relates to piezoelectric thin film elements, and particularly to thin film elements including lead-free alkali-niobate-based piezoelectric materials and methods for manufacturing such piezoelectric thin film elements. The present invention also relates to electronic devices including such piezoelectric thin film elements.

2. Description of the Related Art

Piezoelectric elements operate by the piezoelectric effect of a piezoelectric material. Piezoelectric elements have been widely used as functional electronic components such as actuators, which produce a displacement or vibration in response to a voltage applied to the piezoelectric material, and stress sensors, which produce a voltage in response to a strain applied to the piezoelectric material. In particular, lead-zirconate-titanate-based perovskite-type ferroelectric materials (the formula $Pb(Zr_{1-x}Ti_x)O_3$, PZT) have been widely used in actuators and stress sensors because of their high piezoelectric performance.

PZT, which is a specified hazardous substance containing lead, has been exempted from the RoHS directive (the directive of the European Parliament and of the Council on the restriction of the use of certain hazardous substances in electrical and electronic equipment) because no suitable alternative has been available on the market. However, the growing worldwide awareness of global environmental protection is driving the need for the development of piezoelectric elements that use piezoelectric materials containing no lead (lead-free piezoelectric materials). In addition, the growing need for more compact and lightweight electronic devices is increasing the need for piezoelectric thin film elements manufactured by thin film technology.

An example piezoelectric thin film element that uses a lead-free piezoelectric material is disclosed in Japanese Unexamined Patent Application Publication No. 2007-19302 (Patent Literature 1). This piezoelectric element includes a substrate having thereon a lower electrode, a piezoelectric thin film, and an upper electrode. The piezoelectric thin film is a dielectric thin film made of an alkali-niobate-based perovskite-type compound represented by the formula $(Na_xK_yLi_z)NbO_3$ (where $0<x<1$, $0<y<1$, $0 \leq z<1$, and $x+y+z=1$). A buffer layer is disposed between the piezoelectric thin film and the lower electrode. The buffer layer is a thin film of a material that has a perovskite-type crystal structure and that is readily oriented with a high degree of orientation in the (001), (100), (010), or (111) plane. Patent Literature 1 teaches that such a piezoelectric thin film element that uses a lead-free sodium potassium lithium niobate thin film provides sufficient piezoelectric performance.

A piezoelectric element basically includes a piezoelectric thin film disposed between a pair of electrodes. Depending on the application, the piezoelectric thin film is formed in a beam or fork pattern by microfabrication. Microfabrication processes are one of the important technologies for the commercialization of piezoelectric elements that use lead-free piezoelectric materials.

For example, Japanese Unexamined Patent Application Publication No. 2012-33693 (Patent Literature 2) discloses a method for manufacturing a piezoelectric thin film wafer. This method includes a first step of etching a piezoelectric thin film wafer including a substrate having thereon a piezoelectric thin film (the formula $(K_{1-x}Na_x)NbO_3$, where $0.4 \leq x \leq 0.7$) by ion etching with a gas containing argon and a second step of etching the piezoelectric thin film wafer by reactive ion etching with an etching gas mixture of a fluorinated reactive gas and argon. Patent Literature 2 teaches that this method allows high-precision microfabrication on piezoelectric thin films and provides a reliable piezoelectric thin film element and an inexpensive piezoelectric thin film device.

Chan Min Kang, Gwan-Ha Kim, Kyoung-Tae Kim, and Chang-Il Kim, "Etching Characteristics of $(Na_{0.5}K_{0.5})NbO_3$ Thin Films in an Inductively Coupled $Cl_2/Ar$ Plasma", Ferroelectrics, 357, 179-184 (2007) (Non-Patent Literature 1) reports research on the etching characteristics of $(Na_{0.5}K_{0.5})NbO_3$ in an inductively coupled plasma of a gas mixture of chlorine and argon. Non-Patent Literature 1 reports that the etching rate of $(Na_{0.5}K_{0.5})NbO_3$ increased monotonically with the power supplied to generate the inductively coupled plasma and the negative direct-current bias, as predicted from changes in various plasma parameters. Non-Patent Literature 1 also reports that the etching rate of $(Na_{0.5}K_{0.5})NbO_3$ did not change monotonically with the mixing ratio of chlorine to argon, but a maximum etching rate of 75 nm/min was achieved in a chlorine/argon ratio of 80/20. Non-Patent Literature 1 concludes that this etching rate is due to the combination of the chemical and physical paths in the ion-assisted chemical reaction.

As described above, alkali-niobate-based piezoelectric materials (e.g., sodium potassium lithium niobate, $(Na_xK_yLi_z)NbO_3$) are one of the promising lead-free piezoelectric materials. For the commercialization and mass production of thin film elements that use alkali-niobate-based piezoelectric materials as an alternative to PZT thin film elements, it is important to establish a low-cost, reliable microfabrication process with high dimensional precision.

SUMMARY OF THE INVENTION

However, microfabrication processes on alkali-niobate-based piezoelectric materials, which are a relatively new group of materials, still depend on trial and error. For example, if the etching rate is increased in the dry etching technique disclosed in Patent Literature 2 to improve the productivity, it may damage the remaining piezoelectric thin film and therefore degrade the piezoelectric properties thereof because of some factors. This may decrease the manufacturing yield.

Non-Patent Literature 1, which reports research on the mechanism by which a $(Na_{0.5}K_{0.5})NbO_3$ thin film is etched during dry etching, does not discuss its relationship with the piezoelectric properties of the thin film.

One disadvantage of piezoelectric thin film elements is that even damage to part of the surface of a piezoelectric thin film during microfabrication significantly affects the overall piezoelectric properties because the piezoelectric material, which forms the basis of the element function, has a small absolute volume and a relatively large surface area. As described above, only limited knowledge is available about microfabrication processes on alkali-niobate-based piezoelectric materials because they are a relatively new group of materials, and the factors responsible for the degraded properties are also yet to be understood. Thus, no effective solution has been found.

Accordingly, it is a primary object of the present invention to provide a method for manufacturing a thin film element that uses a lead-free alkali-niobate-based piezoelectric material by microfabrication without degrading the piezoelectric properties thereof. It is another object of the present invention to provide a piezoelectric thin film element manufactured by such a method and an electronic device including such a piezoelectric thin film element.

(I) An aspect of the present invention provides an alkali-niobate-based piezoelectric thin film element including a substrate, a lower electrode film on the substrate, a piezoelectric thin film on the lower electrode film, and an upper electrode film on the piezoelectric thin film. The piezoelectric thin film is made of an alkali-niobate-based piezoelectric material represented by the formula $(Na_xK_yLi_z)NbO_3$, where $0 \leq x \leq 1$, $0 \leq y \leq 1$, $0 \leq z \leq 0.2$, and $x+y+z=1$. The piezoelectric thin film has an element pattern and contains a metal element in a higher concentration near the upper electrode film than near the lower electrode film. The average concentration of the metal element is $5 \times 10^{17}$ atoms/cm$^3$ or less in a region within ±15% of the thickness of the piezoelectric thin film from a position corresponding to half the thickness of the piezoelectric thin film.

The following improvements and modifications may be made to the alkali-niobate-based piezoelectric thin film element according to the above aspect of the present invention.

(i) The average concentration of the metal element is $1 \times 10^{17}$ atoms/cm$^3$ or more in the region within ±15% of the thickness of the piezoelectric thin film from the position corresponding to half the thickness of the piezoelectric thin film.

(ii) The metal element is chromium, gold, or platinum.

(II) Another aspect of the present invention provides an electronic device including the alkali-niobate-based piezoelectric thin film element according to the above aspect of the present invention.

(III) Still another aspect of the present invention provides a method for manufacturing the alkali-niobate-based piezoelectric thin film element according to the above aspect of the present invention. This method includes a lower-electrode-film forming step of forming a lower electrode film on a substrate, a piezoelectric-thin-film forming step of forming a piezoelectric thin film on the lower electrode film, an etching-mask-pattern forming step of forming an etching mask of a desired pattern on the piezoelectric thin film, a piezoelectric-thin-film etching step of dry-etching the piezoelectric thin film into a desired pattern, and an upper-electrode-film forming step of forming an upper electrode film on the piezoelectric thin film etched into the desired pattern. The piezoelectric thin film is made of an alkali-niobate-based piezoelectric material represented by the formula $(Na_xK_yLi_z)NbO_3$, where $0 \leq x \leq 1$, $0 \leq y \leq 1$, $0 \leq z \leq 0.2$, and $x+y+z=1$. The etching mask has a layered structure including an oxide layer and a metal layer, and only the oxide layer is in contact with the piezoelectric thin film. The oxide layer has a thickness of 0.2 to 2 μm.

As used herein, the term "thickness" refers to the average thickness rather than the local thickness.

The following improvements and modifications may be made to the method for manufacturing the alkali-niobate-based piezoelectric thin film element according to the above aspect of the present invention.

(iii) The oxide in the etching mask is silicon oxide and/or aluminum oxide.

(iv) The metal in the etching mask is chromium, gold, or platinum.

(v) The dry etching is reactive ion etching.

(vi) The lower electrode film is made of platinum.

(vii) The piezoelectric thin film has a pseudocubic crystal structure and is formed by sputtering such that the piezoelectric thin film has a main surface preferentially oriented in a (001) plane.

(viii) The substrate is a silicon substrate having a thermally oxidized film thereon.

(ix) The method further includes a dicing step of dicing the substrate having the piezoelectric thin film on which the upper electrode film is formed into a piezoelectric thin film element chip.

According to the above aspects of the present invention, a method for manufacturing a thin film element that uses a lead-free alkali-niobate-based piezoelectric material by microfabrication without degrading the piezoelectric properties thereof can be provided. Thus, a piezoelectric thin film element that maintains the intrinsic high piezoelectric performance of an alkali-niobate-based piezoelectric material and an electronic device including such a piezoelectric thin film element can be provided.

DESCRIPTION OF THE PREFERRED EMBODIMENTS

The inventors have focused on alkali-niobate-based piezoelectric materials ($(Na_xK_yLi_z)NbO_3$, NKLN) as lead-free piezoelectric materials expected to provide a comparable piezoelectric performance to lead zirconate titanate ($Pb(Zr_{1-x}Ti_x)O_3$, PZT), and have conducted extensive research on the dry etching of these materials.

In the related art, an alkali-niobate-based piezoelectric material is dry-etched through an etching mask made of a metal film, mainly for reasons of etching selectivity. The inventors have hypothesized that the degradation of the piezoelectric properties (particularly, leakage current properties) of a piezoelectric thin film during dry etching results from the contamination of the piezoelectric thin film with a metal from the etching mask during the etching. After further research, the inventors have found that the degradation of the piezoelectric properties of a piezoelectric thin film during dry etching can be significantly reduced if at least the layer of the etching mask in contact with the piezoelectric thin film is made of an oxide film to reduce the contamination of the piezoelectric thin film with a metal from the etching mask. These findings have led to the present invention.

A manufacturing process according to an embodiment of the present invention will now be described step by step with reference to the drawings. The present invention, however, should not be construed as being limited to the embodiment discussed below. Various combinations and improvements are possible without departing from the technical scope of the present invention.

FIGS. 1A to 1D are schematic enlarged sectional views illustrating a process of manufacturing an NKLN-piezoelectric-thin-film-deposited substrate according to an embodiment of the present invention (to an etching-mask forming step). Although a cleaning step and a drying step are omitted in the following description, it is preferable to perform these steps if necessary.

A substrate 11 is first provided. The substrate 11 may be made of any material selected depending on the application of the piezoelectric element. Examples of such materials include silicon (Si), silicon-on-insulator (SOI), quartz glass, gallium arsenide (GaAs), sapphire ($Al_2O_3$), metals such as stainless steel, magnesium oxide (MgO), and strontium titanate ($SrTiO_3$). If the substrate 11 is made of a conductive material, it preferably has an electrically insulating film (e.g., an oxide film) thereon. The oxide film may be formed by any process, preferably, for example, by thermal oxidation or chemical vapor deposition (CVD).

Lower-Electrode-Film Forming Step

Figure 1A:
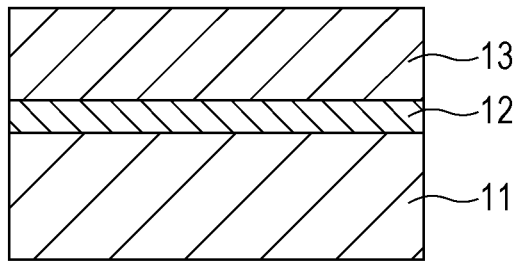
FIGS. 1A to 1D are schematic enlarged sectional views illustrating a process of manufacturing an NKLN-piezoelectric-thin-film-deposited substrate according to an embodiment of the present invention (to an etching-mask forming step)

In this step, a lower electrode film 12 is formed on the substrate 11 (see FIG. 1A). The lower electrode film 12 may be made of any material, preferably platinum (Pt) or a Pt-based alloy. The lower electrode film 12 may be formed by any process, preferably, for example, by sputtering. The lower electrode film 12 preferably has an arithmetic mean surface roughness Ra of 0.86 nm or less so that the resulting piezoelectric thin film, described later, provides sufficient piezoelectric performance.

Piezoelectric-Thin-Film Forming Step

In this step, a piezoelectric thin film 13 is formed on the lower electrode film 12 (see FIG. 1A). The piezoelectric thin film 13 is preferably made of NKLN (($Na_xK_yLi_z$)$NbO_3$, where $0 \leq x \leq 1$, $0 \leq y \leq 1$, $0 \leq z \leq 0.2$, and $x+y+z=1$). The piezoelectric thin film 13 is preferably formed by sputtering or electron beam deposition with a sintered NKLN target. Sputtering and electron beam deposition are advantageous in terms of film reproducibility, deposition rate, and operating cost and also allow the orientation control of an NKLN crystal. For reasons of piezoelectric performance, it is preferable that the resulting piezoelectric thin film 13 be made of an NKLN crystal having a pseudocubic crystal structure and have a main surface preferentially oriented in the (001) plane.

The piezoelectric thin film 13 may contain impurities such as tantalum (Ta), antimony (Sb), calcium (Ca), copper (Cu), barium (Ba), and titanium (Ti) in a total amount of 5 atomic percent or less.

Etching-Mask Forming Step

In this step, an etching mask for dry etching, described later, is formed on the deposited piezoelectric thin film 13. Specifically, a photoresist pattern 14 is first formed on the piezoelectric thin film 13 by a photolithography process (see FIG. 1B).

An etching mask 15 is then deposited on the photoresist pattern 14. In this embodiment, the etching mask 15 has a layered structure including an oxide layer 151 and a metal layer 152, and at least the layer in contact with the piezoelectric thin film 13 is made of the oxide layer 151 (see FIG. 1C). For reasons of ease of handling (e.g., deposition and removal) and cost, the oxide layer 151 is preferably a silicon oxide layer (e.g., a $SiO_2$ layer) or an aluminum oxide layer (e.g., an $Al_2O_3$ layer). The oxide layer 151 may be formed by any process, including known processes such as sputtering, plasma-enhanced CVD, and spin-on-glass (SOG) technique.

The oxide layer 151 of the etching mask 15 preferably has a thickness (average thickness) of 0.2 to 2 μm, more preferably 0.5 to 2 μm, even more preferably 1 to 1.5 μm. If the oxide layer 151 has a thickness of 0.2 μm or more, it can reduce the contamination of the piezoelectric thin film 13 with a metal from the metal layer 152 of the etching mask 15 in the subsequent dry etching step. In other words, the oxide layer 151 functions as a diffusion barrier against the metal layer 152 in the etching mask 15. If the oxide layer 151 has a thickness of more than 2 μm, it will have no greater diffusion barrier effect.

Figure 1B:
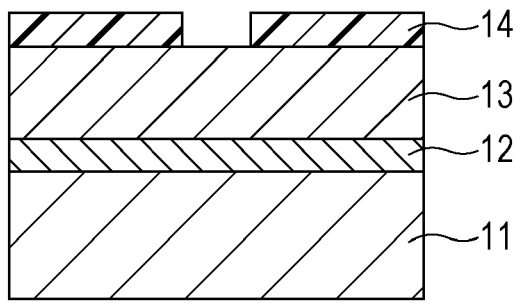
Figure 1C:
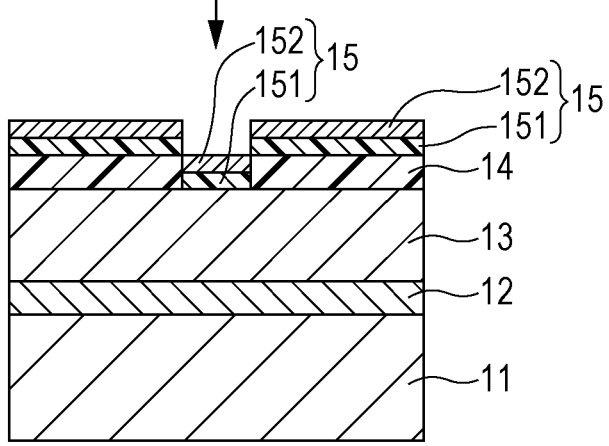

Although the etching mask 15 illustrated in FIG. 1C includes the single oxide layer 151, the oxide layer 151 may have a layered structure including two or more layers. For example, the oxide layer 151 may include a silicon oxide layer formed on the piezoelectric thin film 13 and an aluminum oxide layer formed on the silicon oxide layer (between the silicon oxide layer and the metal layer 152). If the oxide layer 151 has a layered structure including two or more layers, it has a greater diffusion barrier effect against the metal layer 152.

The metal layer 152 is then formed on the oxide layer 151. The metal layer 152 is preferably made of a material that exhibits a higher etching selectivity than the oxide layer 151 in the subsequent dry etching step. For example, the metal layer 152 is preferably made of a metal such as chromium (Cr), gold (Au), or Pt. The metal layer 152 may be formed by any process, including known processes (such as sputtering).

Figure 1D:
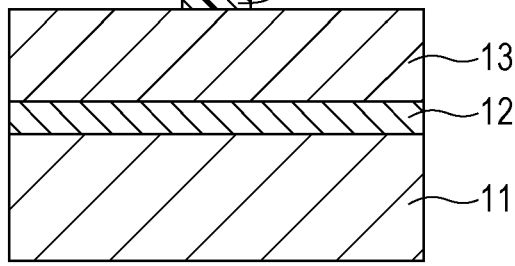

An etching mask pattern 15' (patterned oxide layer 151' and metal layer 152') of the desired pattern is then formed by a lift-off process (see FIG. 1D). The etching mask pattern 15' may also be formed by processes other than photolithography and lift-off.

Piezoelectric-Thin-Film Etching Step

Figure 2A:
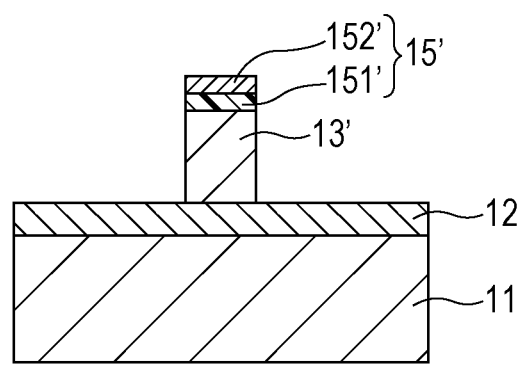
FIGS. 2A to 2B are schematic enlarged sectional views illustrating the process of manufacturing an NKLN-piezoelectric-thin-film-deposited substrate according to the embodiment of the present invention (piezoelectric-thin-film etching step)
Figure 2B:
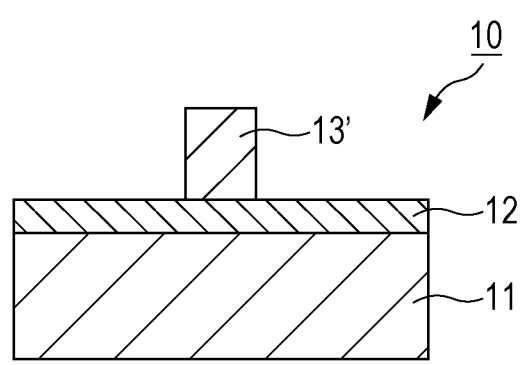

FIGS. 2A to 2B are schematic enlarged sectional views illustrating the process of manufacturing an NKLN-piezoelectric-thin-film-deposited substrate according to this embodiment (piezoelectric-thin-film etching step). In this step, the piezoelectric thin film 13 is dry-etched into the pattern defined by the etching mask pattern 15' (see FIG. 2A). The piezoelectric thin film 13 may be etched by any dry etching process, preferably by inductively coupled plasma reactive ion etching (ICP-RIE). As the etching gas, it is preferred to use a noble gas (e.g., argon (Ar)) and a reactive gas (e.g., trifluoromethane (CHF$_3$), tetrafluoromethane (CF$_4$), hexafluoroethane (C$_2$F$_6$), octafluorocyclobutane (C$_4$F$_8$), orsulfur hexafluoride (SF$_6$)). In this method, a piezoelectric thin film pattern 13' of the desired pattern can be formed.

In this embodiment, as described above, the use of the etching mask pattern 15', which has a layered structure including the oxide layer 151' and the metal layer 152', reduces the contamination of the piezoelectric thin film pattern 13' with a metal element from the metal layer 152'. In this embodiment, the average concentration of the contaminant metal in the region within ±15% of the thickness of the piezoelectric thin film from the position corresponding to half the thickness of the piezoelectric thin film is used as a measure of the content of the contaminant metal, taking into account the overall influence on piezoelectric properties. The average concentration of the contaminant metal in the region defined above is preferably $5\times10^{17}$ atoms/cm$^3$ or less, more preferably $4\times10^{17}$ atoms/cm$^3$ or less, even more preferably $3\times10^{17}$ atoms/cm$^3$ or less. The contaminant metal, however, will probably be present in a concentration of about $1\times10^{17}$ atoms/cm$^3$ or more as long as the metal layer 152' is used as the etching mask pattern 15'.

After dry etching, the oxide layer 151' is removed with a suitable etchant (e.g., buffered hydrofluoric acid for silicon oxide) to obtain a piezoelectric-thin-film-deposited substrate 10 including the NKLN piezoelectric thin film etched into the desired pattern (see FIG. 2B).

Upper-Electrode-Film Forming Step

Figure 3A:
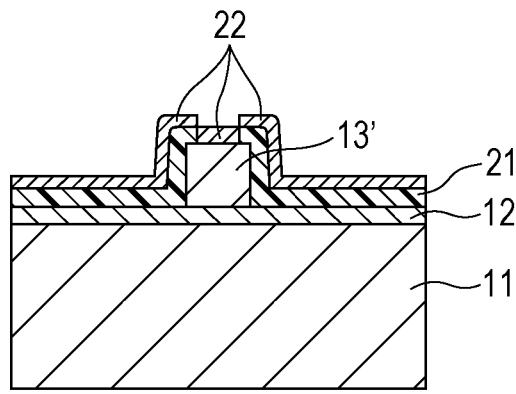
FIGS. 3A to 3C are schematic enlarged sectional views illustrating a process of manufacturing an NKLN piezoelectric thin film element according to the embodiment of the present invention (upper-electrode-film forming step and later)
Figure 3B:
Figure 3B:
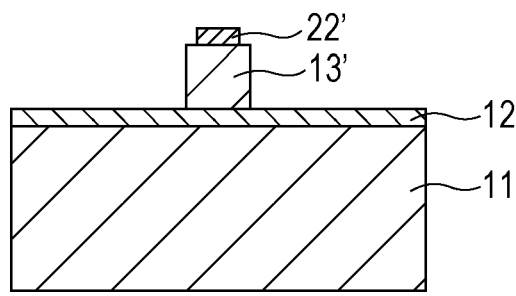
Figure 3C:
Figure 3C:
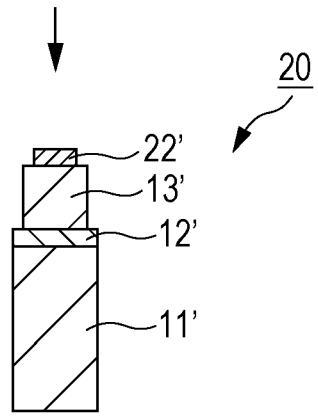

FIGS. 3A to 3C are schematic enlarged sectional views illustrating a process of manufacturing an NKLN piezoelectric thin film element according to this embodiment (upper-electrode-film forming step and later). In this step, an upper electrode film is formed on the piezoelectric thin film etched into the desired pattern in the previous step (piezoelectric thin film pattern 13'). Specifically, a photoresist pattern 21 is first formed in the region other than the region in which the upper electrode film is to be formed by a photolithography process, and an upper electrode film 22 is deposited on the photoresist pattern 21 (see FIG. 3A). The photoresist pattern 21 is then removed by a lift-off process to leave an upper electrode film 22' (see FIG. 3B). Examples of suitable materials for the upper electrode film 22 (upper electrode film 22') include Al, Au, nickel (Ni), and Pt.

Dicing Step

In this step, the substrate having the piezoelectric thin film pattern 13' on which the upper electrode film 22' is formed is diced into a piezoelectric thin film element chip 20 (see FIG. 3C). The piezoelectric thin film element 20 includes a substrate chip 11' and a lower electrode film 12' thereon. In this method, the piezoelectric thin film element 20 including the NKLN piezoelectric thin film etched into the desired pattern can be fabricated.

Electronic Device Including Piezoelectric Thin Film Element

The thus-fabricated piezoelectric thin film element 20 can be used to provide environmentally friendly high-performance lead-free electronic components, including microsystem devices (e.g., micro-electro-mechanical system (MEMS) devices), stress/pressure sensors, actuators, and variable capacitors.

EXAMPLES

The present invention is further illustrated by the following examples, although the present invention is not limited to these examples.

Fabrication of Piezoelectric-Thin-Film-Deposited Substrates of Examples 1 to 5 and Comparative Examples 1 and 2

Piezoelectric-thin-film-deposited substrates 10 including a piezoelectric thin film etched into the desired pattern were fabricated by the manufacturing process illustrated in FIGS. 1A to 2B. The substrate 11 was a silicon substrate having a thermally oxidized film thereon (4 inch (100)-oriented wafer with a wafer thickness of 0.525 mm having thereon a thermally oxidized film with a thickness of 205 nm).

A Ti layer was first deposited to a thickness of 2.5 nm on the silicon substrate by radio-frequency (RF) magnetron sputtering to form an adhesion layer for improving the adhesion between the substrate 11 and the lower electrode film 12. A Pt layer was then deposited to a thickness of 200 nm on the Ti layer by RF magnetron sputtering to form a lower electrode film 12 (see FIG. 1A). The adhesion layer and the lower electrode film 12 were deposited by sputtering with a pure Ti target and a pure Pt target, respectively, at a substrate temperature of 250° C. and a discharge power of 200 W in an Ar atmosphere at a pressure of 2.5 Pa. The arithmetic mean surface roughness Ra of the deposited lower electrode film 12 was measured to be 0.86 nm or less. The sputtering system used was an RF sputtering system (SH-350-T10 from ULVAC, Inc.) (the same applies hereinafter).

A (Na$_{0.65}$K$_{0.35}$)NbO$_3$ (hereinafter referred as "NKN") thin film was then deposited to a thickness of 2 won the lower electrode film 12 by RF magnetron sputtering to forma piezoelectric thin film 13 (see FIG. 1A). The NKN thin film was deposited by sputtering with a sintered NKN target at a substrate temperature of 520° C. and a discharge power of 700 W in a mixed atmosphere of oxygen (O$_2$) gas and Ar gas (in an O$_2$/Ar ratio of 0.005) at a pressure of 1.3 Pa.

A photoresist (ZPN1150 from Zeon Corporation) was then applied, exposed, and developed on the NKN piezoelectric thin film to form a photoresist pattern 14 (see FIG. 1B). A SiO$_2$ film was then deposited to a thickness of 0.2 to 1.5 µm by RF magnetron sputtering to form an oxide layer 151 (Examples 1 to 5, see FIG. 1C). The SiO$_2$ film was deposited by sputtering with a quartz plate target at a substrate temperature of 25° C. and a discharge power of 400 W in a mixed atmosphere of O$_2$ gas and Ar gas (in an O$_2$/Ar ratio of 0.033) at a pressure of 0.7 Pa.

A Cr film (thickness: 0.4 µm) was then deposited on the oxide layers 151 with varying thicknesses by RF magnetron sputtering to forma metal layer 152 (Examples 1 to 3, see FIG. 1C). The Cr film was deposited by sputtering with a pure Cr target at a substrate temperature of 25° C. and a discharge power of 50 W in an Ar atmosphere at a pressure of 0.8 Pa.

Alternatively, a Au film (thickness: 0.4 µm) or a Pt film (thickness: 0.4 µm) was deposited on the SiO$_2$ film (oxide layer 151) with a thickness of 1 µm by RF magnetron sputtering to form different types of metal layers 152 (Examples 4 and 5, see FIG. 1C). The Au film or the Pt film was deposited by sputtering with a pure Au target or a pure Pt target at a substrate temperature of 25° C. and a discharge power of 50 Win an Ar atmosphere at a pressure of 0.8 Pa.

A comparative sample was prepared by directly depositing a Cr film (thickness: 0.4 µm) on the NKN piezoelectric thin film by RF magnetron sputtering (Comparative Example 1). In addition, a comparative sample was prepared by depositing a SiO$_2$ film to a thickness of 0.1 µm to form an oxide layer 151 and then depositing a Cr film to a thickness of 0.4 µm to form a metal layer 152 by RF magnetron sputtering (Comparative Example 2). The $SiO_2$ film and the Cr film were deposited under the same conditions as described above.

Thereafter, the photoresist pattern 14 was removed by cleaning with acetone (lift-off) to form an etching mask pattern 15' on the NKN piezoelectric thin film (see FIG. 1D). The type of etching mask pattern 15' is shown in Table below.

Etching Test

The samples having the various etching mask patterns were dry-etched in an ICP-RIE system (EIS-700 from Elionix Inc.) under the same etching conditions. The samples were etched at an antenna power of 800 W and a bias power of 100 W using Ar and $C_4F_8$ as the etching gas at a pressure of 0.1 Pa.

After the dry etching of the NKN piezoelectric thin film, the samples having an etching mask pattern 15' including a $SiO_2$ layer (Examples 1 to 5 and Comparative Example 2) were etched with an etchant for $SiO_2$ (buffered hydrofluoric acid) to remove the etching mask pattern 15'. The sample having a Cr mask alone (Comparative Example 1) was etched with an etchant for Cr (ceric ammonium nitrate) to remove the etching mask pattern.

Fabrication of Piezoelectric Thin Film Element

A photoresist pattern 21 was formed on the NKN piezoelectric thin film of the thus-fabricated piezoelectric-thin-film-deposited substrates 10 by the manufacturing process illustrated in FIGS. 3A to 3C, and an upper electrode film 22 (thickness: 200 nm) was deposited by RF magnetron sputtering (see FIG. 3A). The upper electrode film 22 was deposited under the same conditions as the lower electrode film 12, i.e., by sputtering with a pure Pt target at a substrate temperature of 250° C. and a discharge power of 200 W in an Ar atmosphere at a pressure of 2.5 Pa.

Thereafter, the photoresist pattern 21 was removed by cleaning with acetone (lift-off) to leave an upper electrode film 22' on the NKN piezoelectric thin film (see FIG. 3B). The piezoelectric-thin-film-deposited substrates 10 were then diced into NKN piezoelectric thin film element chips.

A reference sample was also prepared by depositing an upper electrode film 22 (thickness: 200 nm) on an NKN piezoelectric thin film not patterned by dry etching. This sample, which was not affected by the etching mask pattern 15' and dry etching, was prepared as a reference for the contamination of the NKN piezoelectric thin film with a metal element from the metal layer 152' (i.e., the contaminant metal concentration) and the piezoelectric properties of the NKN piezoelectric thin film.

Measurement of Concentration of Contaminant Metal from Metal Layer of Etching Mask in Piezoelectric Thin Film To examine the content of the contaminant metal from the metal layer 152 of the etching mask pattern 15' in the piezoelectric thin film 13', the contaminant metal concentration of the piezoelectric thin film 13' was measured by secondary ion mass spectrometry (SIMS) after the piezoelectric-thin-film etching step. The primary ion beam (excitation source) used in SIMS was an oxygen ion beam ($O^-$, $O_2^+$ or $Cs^+$ ion beam).

The contamination of the piezoelectric thin film 13' with metal atoms from the metal layer 152' is assumed to be a type of diffusion phenomenon. Therefore, the metal concentration is expected to be high near the surface of the piezoelectric thin film 13' (near the etching mask pattern 15') and to decrease gradually along the depth of the piezoelectric thin film 13' (along the thickness toward the lower electrode film 12).

Figure 4:
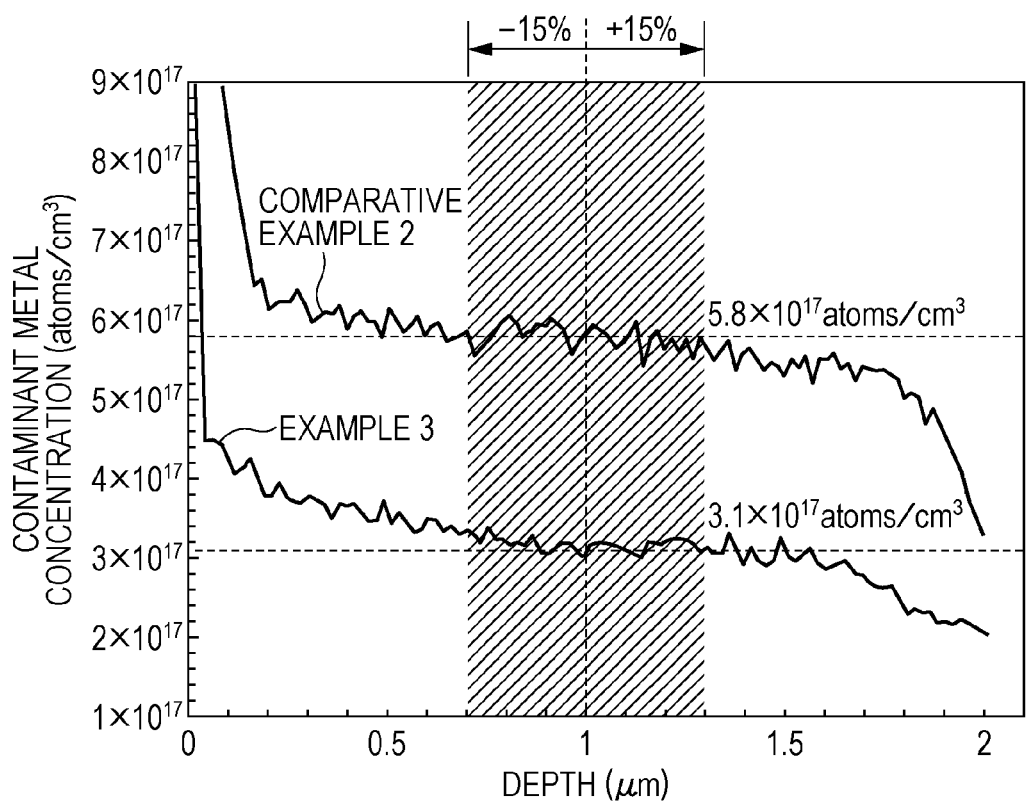
FIG. 4 is a chart showing example measurements of contaminant metal (Cr) concentration for Comparative Example 2 and Example 3.

FIG. 4 is a chart showing example measurements of the contaminant metal (Cr) concentration for Comparative Example 2 and Example 3. As shown in FIG. 4, in both cases, the contaminant metal concentration was high near the surface of the piezoelectric thin film (near a depth of 0 μm) and decreased along the thickness of the piezoelectric thin film (toward a depth of 2 μm). The contaminant metal concentration of Example 3 as a whole was lower than that of Comparative Example 2. Specifically, the measurements show that the average contaminant metal concentration of Example 3 in the region within ±15% of the thickness of the piezoelectric thin film (i.e., ±0.3 μm) from the position corresponding to half the thickness of the piezoelectric thin film (i.e., a depth of 1 μm) was about $3\times10^{17}$ atoms/cm$^3$, which is about half that of Comparative Example 2, i.e., about $6\times10^{17}$ atoms/cm$^3$.

Figure 5:
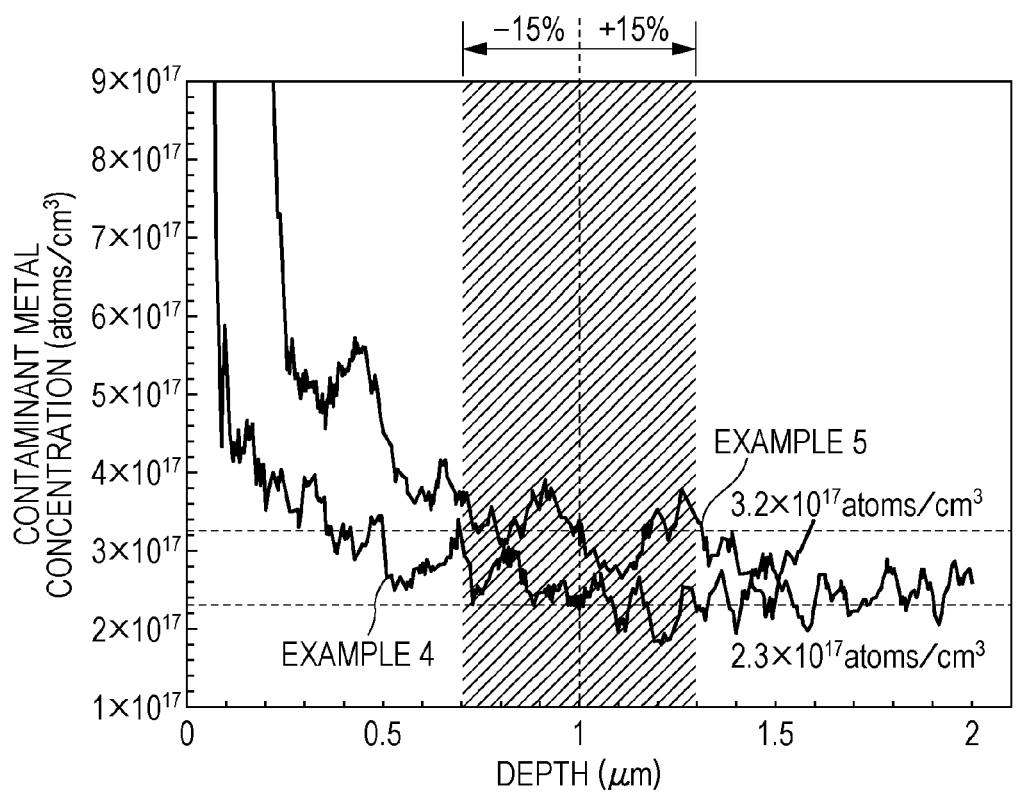
FIG. 5 is a chart showing example measurements of contaminant metal (Au or Pt) concentration for Examples 4 and 5.

FIG. 5 is a chart showing example measurements of the contaminant metal (Au or Pt) concentration for Examples 4 and 5. As in FIG. 4, the contaminant metal concentrations of Examples 4 and 5 were high near the surface of the piezoelectric thin film (near a depth of 0 μm) and decreased along the thickness of the piezoelectric thin film (toward a depth of 2 μm). The average contaminant metal concentrations of Examples 4 and 5 in the region within ±15% of the thickness of the piezoelectric thin film (i.e., ±0.3 μm) from the position corresponding to half the thickness of the piezoelectric thin film (i.e., a depth of 1 μm) were about $2\times10^{17}$ atoms/cm$^3$ and about $3\times10^{17}$ atoms/cm$^3$, respectively, which are about half that of Comparative Example 2 or less.

These results demonstrate that the contamination of the piezoelectric thin film with metal atoms from the metal layer is due to the diffusion phenomenon during the piezoelectric-thin-film etching step. The results also demonstrate that the oxide layer of the etching mask pattern functions as a diffusion barrier against the metal layer. The measurements taken from the other samples are listed together in Table below.

Measurement and Evaluation of Piezoelectric Properties

The resulting NKN piezoelectric thin film elements were examined using a ferroelectric property evaluation system for their dielectric loss tangent (tan δ), leakage current density, and polarization.

Figure 6:
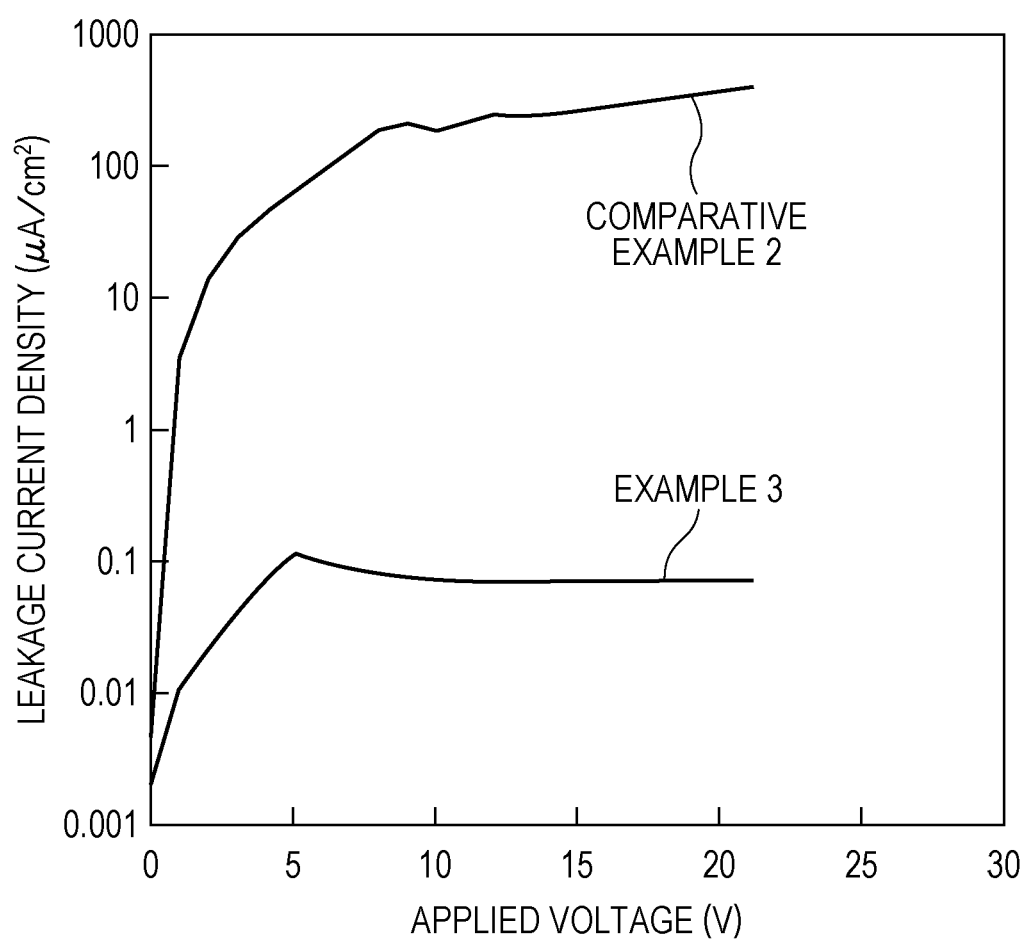
FIG. 6 is a graph showing example relationships between leakage current density and applied voltage for Comparative Example 2 and Example 3.

FIG. 6 is a graph showing example relationships between the leakage current density and the applied voltage for Comparative Example 2 and Example 3. As shown in FIG. 6, in both cases, the leakage current density increased with increasing applied voltage. Specifically, the leakage current density tended to increase abruptly in the low voltage region (e.g., below about 5 V) and to remain substantially constant in the higher voltage region. It should be noted that measurements of the leakage current density that differ by one order of magnitude or less in the region where the absolute values of the measurements are low (e.g., on the order of $10^0$ μA/cm$^2$ or less) can be assumed to be practically equal because of the method of measurement.

The measurements of the dielectric loss tangent (tan δ) and the leakage current density are shown in Table together with the type of etching mask pattern and the average contaminant metal concentration. The measurements of the piezoelectric properties are representative values of measurements taken from 10 elements at an applied voltage of 20 V.

Table Type of Etching Mask Pattern and Measurements of Average Contaminant Metal Concentration and Piezoelectric Properties

| | Type of etching mask pattern | | | | Average contaminant metal concentration (atoms/cm³) | Piezoelectric properties | |
|---|---|---|---|---|---|---|---|
| | Thickness of SiO₂ film (μm) | Thickness of Cr film (μm) | Thickness of Au film (μm) | Thickness of Pt film (μm) | | tanδ | Leakage current density (μA/cm²) |
| Reference sample | No dry etching | | | | $5 \times 10^{13}$ | 0.20 | 0.9 |
| Comparative Example 1 | — | 0.4 | — | — | $5 \times 10^{18}$ | 0.76 | 3,760 |
| Comparative Example 2 | 0.1 | 0.4 | — | — | $6 \times 10^{17}$ | 0.27 | 396 |
| Example 1 | 0.2 | 0.4 | — | — | $5 \times 10^{17}$ | 0.21 | 3.4 |
| Example 2 | 1 | 0.4 | — | — | $4 \times 10^{17}$ | 0.21 | 1.6 |
| Example 3 | 1.5 | 0.4 | — | — | $3 \times 10^{17}$ | 0.21 | 0.1 |
| Example 4 | 1 | — | 0.4 | — | $2 \times 10^{17}$ | 0.20 | 0.5 |
| Example 5 | 1 | — | — | 0.4 | $3 \times 10^{17}$ | 0.21 | 1.5 |

As shown in Table, the reference sample, which was not affected by dry etching, had an extremely low average contaminant metal concentration (nearly below the detection limit) and exhibited a sufficiently low dielectric loss tangent (tan δ) and leakage current density. This demonstrates that the NKN piezoelectric thin film formed in the above examples was a high-quality piezoelectric thin film.

In contrast, in Comparative Example 1, in which a metal film etching mask in the related art was used alone, the average contaminant metal concentration was five orders of magnitude higher than that of the reference sample. Accordingly, the dielectric loss tangent was nearly four times higher than that of the reference sample, and the leakage current density was at least three orders of magnitude higher than that of the reference sample. This demonstrates that the piezoelectric properties were noticeably degraded.

In Comparative Example 2, which is beyond the scope of the present invention, the average contaminant metal concentration was about one order of magnitude lower than that of Comparative Example 1. Accordingly, the dielectric loss tangent was about one-third that of Comparative Example 1, and the leakage current density was about one order of magnitude lower than that of Comparative Example 1. The leakage current density, however, was at least two orders of magnitude higher than that of the reference sample. This demonstrates that the oxide layer of the etching mask pattern had an insufficient effect (diffusion barrier effect against the metal layer).

In contrast to these comparative examples, in Examples 1 to 5, which are within the scope of the present invention, the dielectric loss tangent was comparable to that of the reference sample, and the leakage current density was on the order of $10^{-1}$ to $10^0$ μA/cm². The leakage current densities of Examples 1 to 5 are comparable to that of the reference sample because, as described above, leakage current densities that differ by one order of magnitude or less in the region on the order of $10^0$ μA/cm² or less can be assumed to be practically equal. This demonstrates that the piezoelectric properties of the NKN piezoelectric thin films of Examples 1 to 5 were not degraded during microfabrication.

Figure 7:
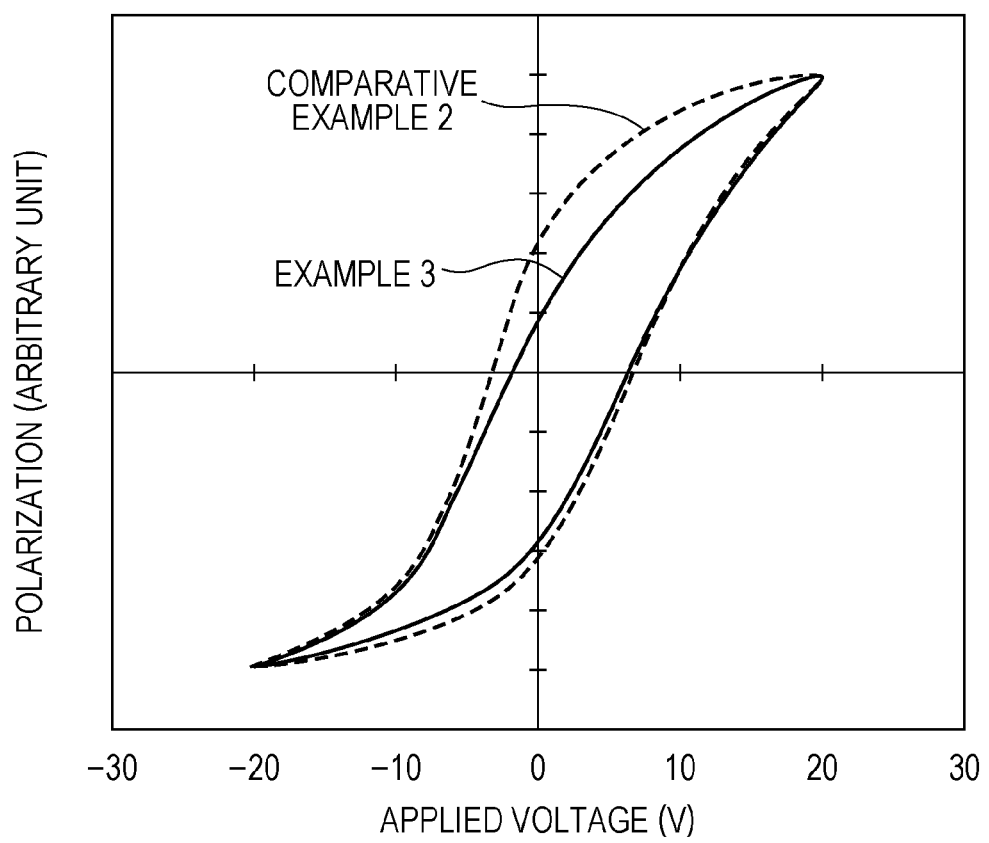
FIG. 7 is a graph showing example relationships between polarization and applied voltage for Comparative Example 2 and Example 3.

FIG. 7 is a graph showing example relationships between the polarization and the applied voltage for Comparative Example 2 and Example 3. As shown in FIG. 7, Comparative Example 2 showed a wide polarization hysteresis loop, demonstrating that the ferroelectric properties were degraded. In contrast, Example 3 showed a narrow polarization hysteresis loop. This demonstrates that the ferroelectric properties of the NKN piezoelectric thin film of Example 3 were not degraded during dry etching.

As demonstrated above, according to embodiments of the present invention, a thin film element that uses an alkali-niobate-based piezoelectric material can be manufactured by microfabrication without degrading the piezoelectric properties thereof. Thus, a piezoelectric thin film element that maintains the intrinsic high piezoelectric performance of an alkali-niobate-based piezoelectric material and an electronic device including such a piezoelectric thin film element can be provided.

The foregoing embodiments and examples have been described in order to assist in understanding the present invention. The present invention should not be construed as being limited to the specific configurations disclosed herein. For example, part of the configuration of a certain embodiment may be replaced by the configuration of another embodiment, or the configuration of a certain embodiment may be added to the configuration of another embodiment. Thus, part of the configurations of the embodiments and examples disclosed herein may be removed or replaced by another configuration, or another configuration may be added thereto.

What is claimed is:

1. An alkali-niobate-based piezoelectric thin film element comprising:
   a substrate;
   a lower electrode film on the substrate;
   a piezoelectric thin film on the lower electrode film, the piezoelectric thin film comprising an alkali-niobate-based piezoelectric material represented by the formula $(Na_xK_yLi_z)NbO_3$, where $0 \le x \le 1$, $0 \le y \le 1$, $0 \le z \le 2$, and $x+y+z=1$; and
   an upper electrode film on the piezoelectric thin film, wherein
   the piezoelectric thin film has a desired micro pattern formed for a piezoelectric element and contains a metal element in a higher concentration near the upper electrode film than near the lower electrode film, the metal element being chromium, gold or platinum, and
   the average concentration of the metal element is $5 \times 10^{17}$ atoms/cm³ or less in a region within ±15% of the thickness of the piezoelectric thin film from a position corresponding to half the thickness of the piezoelectric thin film.

2. The alkali-niobate-based piezoelectric thin film element according to claim 1, wherein the average concentration of the metal element is $1\times10^{17}$ atoms/cm$^3$ or more in the region within ±15% of the thickness of the piezoelectric thin film from the position corresponding to half the thickness of the piezoelectric thin film.

3. An electronic device comprising the alkali-niobate-based piezoelectric thin film element according to claim 1.

* * * * *